US007772941B2

(12) United States Patent
Yeung et al.

(10) Patent No.: US 7,772,941 B2
(45) Date of Patent: Aug. 10, 2010

(54) ULTRA-WIDEBAND/DUALBAND BROADSIDE-COUPLED COPLANAR STRIPLINE BALUN

(75) Inventors: Lap-Kun Yeung, Los Angeles, CA (US); Angus C. K. Mak, Hong Kong (CN); Corbett R. Rowell, Hong Kong (CN)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 85 days.

(21) Appl. No.: 12/137,993

(22) Filed: Jun. 12, 2008

(65) Prior Publication Data

US 2009/0309672 A1 Dec. 17, 2009

(51) Int. Cl.
*H03H 7/42* (2006.01)
*H01P 3/08* (2006.01)

(52) U.S. Cl. ........................................ 333/26; 333/238

(58) Field of Classification Search .......... 343/700 MS; 333/25, 26, 35, 238
See application file for complete search history.

(56) References Cited

U.S. PATENT DOCUMENTS

| | | | | |
|---|---|---|---|---|
| 6,201,439 | B1 * | 3/2001 | Ishida et al. | 330/124 R |
| 7,088,299 | B2 * | 8/2006 | Siegler et al. | 343/745 |
| 7,265,644 | B2 * | 9/2007 | Floyd et al. | 333/26 |
| 7,518,557 | B2 * | 4/2009 | Lin et al. | 343/700 MS |
| 7,528,676 | B2 * | 5/2009 | Kearns et al. | 333/26 |
| 2009/0206957 | A1 * | 8/2009 | Hiroshima et al. | 333/219.1 |

* cited by examiner

*Primary Examiner*—Dean O Takaoka
(74) *Attorney, Agent, or Firm*—Fulbright & Jaworski L.L.P.

(57) ABSTRACT

A balun comprises at least two asymmetric coplanar striplines, a first of the striplines coupled to a signal input, and a second of the striplines coupled to a signal output, the at least two asymmetric coplanar striplines configured in a Marchand architecture to receive an unbalanced signal and to output a balanced signal.

23 Claims, 8 Drawing Sheets

ULTRA-WIDEBAND/DUALBAND BROADSIDE-COUPLED COPLANAR STRIPLINE BALUN

TECHNICAL FIELD

The present description relates, in general, to baluns and, more specifically, to Marchand baluns utilizing asymmetric coplanar striplines.

BACKGROUND

Antennas are typically of two types, namely symmetrical or balanced, and asymmetrical or unbalanced. FIG. 1 depicts a typical unbalanced antenna 100. The antenna 100 includes monopole 101 and ground 102. The input or feed structure is also unbalanced, and may be a coaxial cable 104 with ground shielding 103 or a micro-stripline (not shown). The unbalanced antenna has a single element for the total energy of the signal, which alternates + (positive) and – (negative). Note that the ground plane functions as part of the antenna, and thus strongly affects the performance of the antenna. The antenna can be detuned if the size of the ground place is between 0.25 and 2 wavelengths of the antenna resonant frequency. Other elements connected to the ground plane can also detune the antenna. Since antenna resonant frequency and performance depends on the shape of the device, each antenna needs to be customized, leading to higher design and production costs. However, since there are multiple radiating elements, the antenna 100 is useful for multi-band applications, e.g. mobile phones. However, if the RF module that provides the signal to the antenna 100 is balanced, an additional balun type antenna is required, which introduces additional losses and decreases the antenna's radiation performance. Examples of antenna 100 are monopole, patch, and PIFA (planar inverted-F antenna).

FIG. 2 depicts a typical balanced antenna 200. The antenna 200 includes loop 201 with ground 204. The input or feed structure is also balanced, and comprises separate + input 202 and – input 203 for each part of the alternating signal. The feed structure may comprise a coplanar microstrip line or two-wire transmission line. Note that with this arrangement, the ground plane is essentially independent from the antenna and has little effect on the performance of the antenna. Thus, the antenna resonant frequency and performance depends on the shape of the device, and a single antenna can work with a variety of ground plane geometries. However, since this arrangement has a symmetric geometry, the size of the antenna is double that of an equivalent unbalanced antenna. This antenna has a single radiating element and can be configured to operate in wide-band single resonance applications, such a magnetic resonance imaging (MRI) device and other inductive coupling applications.

In designing electronic circuits, e.g. mixers or amplifiers, balun antennas are used to link a symmetrical or balanced circuit with an asymmetrical or unbalanced circuit. Thus, a balun can be used to change an unbalanced signal to a balanced signal in order to drive a balanced antenna element, or vice versa. FIG. 3 depicts a typical Marchand type balun antenna 300. The Marchand balun has an unbalanced input 303 and a balanced output 301. The input goes to two coupled line sections 304, 305, the lengths of which are λ/4 (a quarter wavelength) of the input signal. The portions of the line sections that are connected to the outputs are shorted to ground. The portions of the line sections that are connected to the input are connected to an open circuit (OC). The Marchand balun operates through the coupling that occurs between the lines. The balun offers good amplitude balance and phase difference with a relatively wide operating bandwidth.

Note that in the balun of FIG. 3, the operating bandwidth is mainly controlled by the coupling strength of the two coupled-line sections. There are two types of coupled-lines, namely edge coupled and coplanar coupled. FIGS. 4A and 4B depict examples of edge coupled lines 401, and coplanar coupled lines 402, respectively. In FIG. 4A, the signal line 403 couples with line 406. The couple lines are separated from a ground place 404 by dielectric material 405. This coupling is referred to an edge coupling. With this arrangement, manufacturing capability limits the coupling strength between a pair microstrips. In FIG. 4B, the signal line 403 couples with line 406. The couple lines are separated by dielectric material 405. Ground plane 404 are adjacent to the couple lines. This arrangement is referred to as a coplanar waveguide configuration or broadside configuration, where one coplanar waveguide (e.g. 403) is on the top of the dielectric 405 and another coplanar waveguide (e.g. 406) is on the bottom of the dielectric. Strong coupling can be achieved by a pair lines in this arrangement.

There are two types of coplanar coupling, namely symmetrical and asymmetrical. FIGS. 5A and 5B depict examples of symmetrical 501 and asymmetrical 502 coplanar coupled lines, respectively. In FIG. 5A, the signal line 503 is coplanar with line 504 and separated by dielectric layer 508. The ground planes 505 and 506 are also coplanar and separated by dielectric layer 508. In FIG. 5B, the signal line 503 is coplanar with line 504 and separated by dielectric layer 508. However, the ground planes 505 and 507 are not arranged in the same manner as the signal lines. This arrangement is referred to as asymmetric coplanar striplines (ACPS), and can be used to reduce the space for grounding, while still achieving strong coupling. The ACPS striplines will also have a wide bandwidth as the symmetrical coplanar striplines of FIG. 5A. A Marchand balun based on ACPS coupling has a small size and a wide operating bandwidth.

Inhomogeneous media can cause a large difference between the even-mode and odd-mode velocities. A large difference degrades the performance of the balun. An arrangement that has a nonuniform ACPS that is covered with a dielectric can be used to overcome this problem. FIGS. 6A and 6B depict different views of a nonuniform ACPS coupler 600. In this arrangement, the ground place is formed into an irregular shape. This arrangement improves performance of the bandwidth, because it reduces the difference in the even and odd mode velocities through the waveguides.

BRIEF SUMMARY OF THE INVENTION

Various embodiments of the invention are directed to a nonuniform, asymmetric coplanar stripline Marchand balun and methods for use of such a balun. A balun formed according to embodiments of the invention can have an unbalanced input and a balanced output, or vice versa. Such a balun can be used to feed a balanced antenna from an unbalanced signal feed, or vice versa.

One embodiment of the invention is to use ACPS to form a Marchand balun with strong coupling, and thus achieving a balun with wideband characteristic and small in size. The wideband balun is easier to fabricate and small in size for ultrawide bandwidth (UWB) applications. The UWB balun may be formed from one or two PCB layers having two layers of conductors. It is preferable to use a single PCB layer. In contrast, a prior art UWB balun tends to be very complicated and require three or more PCB layers, and thus is large in size.

Another embodiment of the invention is to form a balun using an open-circuit stub to introduce a rejection at the middle of the operating band to make a dualband balun. This embodiment simplifies the design of dualband wireless frontend systems.

Embodiments of the invention can be used to drive balanced antenna elements in a variety of applications. For example, one or more embodiments can be used to drive balanced antennas in an MRI system. Typical MRI systems use loop antennas to generate a large amount of magnetic field, and the loop antennas can be fed by baluns according to embodiments of the present invention. Further, various embodiments can be used in near-field applications, such as radio frequency identification (RFID). Other applications include the use in single layer superconducting elements.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Embodiments of the invention use asymmetric coplanar striplines (ACPS) to form a Marchand balun with strong coupling, and thus achieving a balun with wideband characteristic and small in size. Embodiments use an open-circuit stub to introduce a rejection at the middle of the operating band to make a dualband balun. The dualband balun simplifies the design of dualband wireless frontend systems. Embodiments of the invention can form a wideband balun that is small in size for ultrawide bandwidth (UWB) applications.

Figure 1:
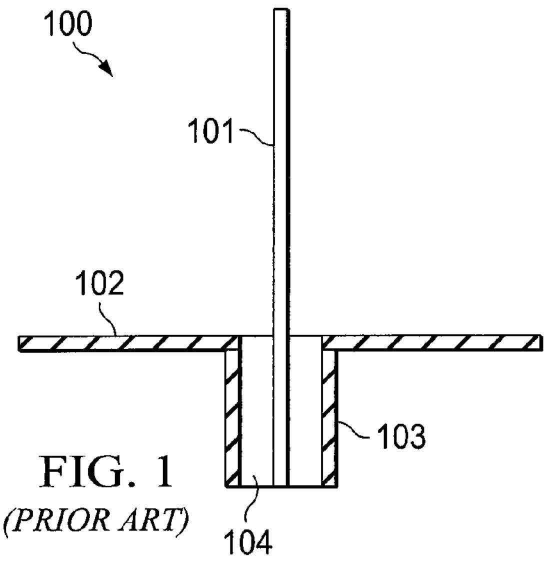
FIG. 1 (PRIOR ART)
FIG. 1 depicts a typical unbalanced antenna.
Figure 2:
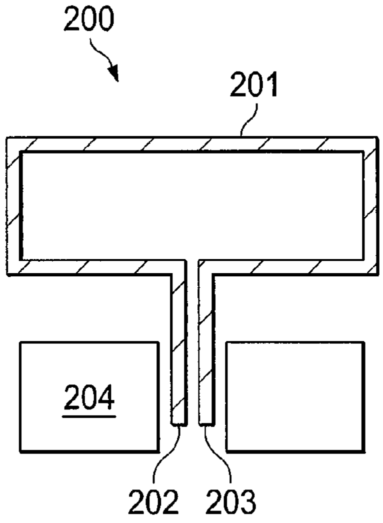
FIG. 2 (PRIOR ART)
FIG. 2 depicts a typical balanced antenna.
Figure 3:
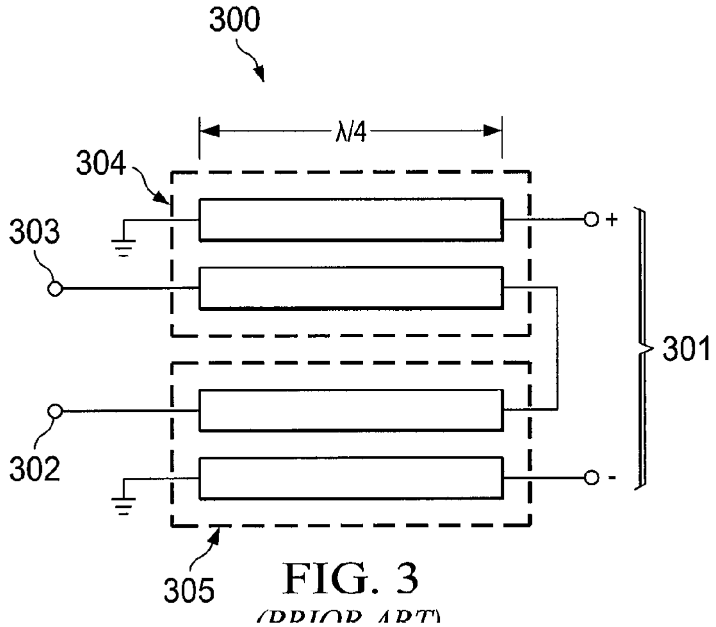
FIG. 3 (PRIOR ART)
FIG. 3 depicts a typical Marchand type balun antenna.
Figure 4A:
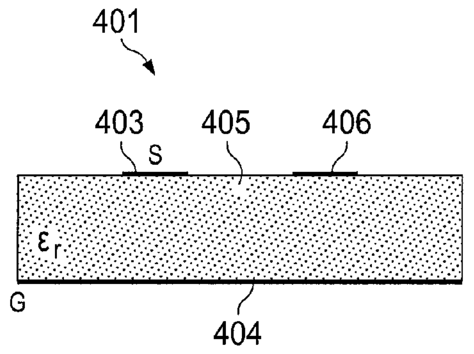
FIGS. 4A and 4B depict examples of edge coupled lines and coplanar coupled lines, respectively.
Figure 4B:
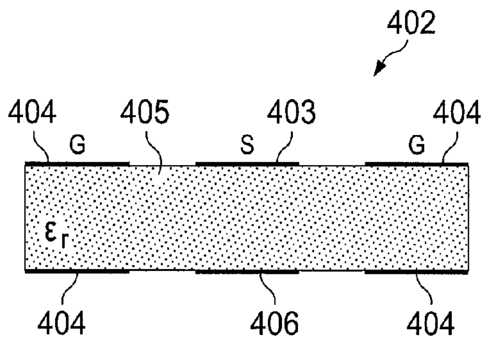
Figure 5A:
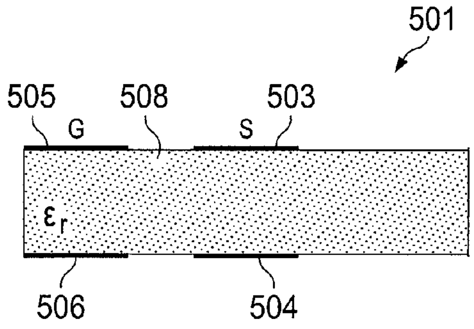
FIGS. 5A and 5B depict examples of symmetrical and asymmetrical coplanar coupled lines, respectively.
Figure 5B:
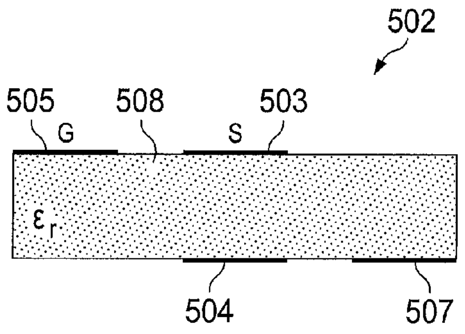
Figure 6A:
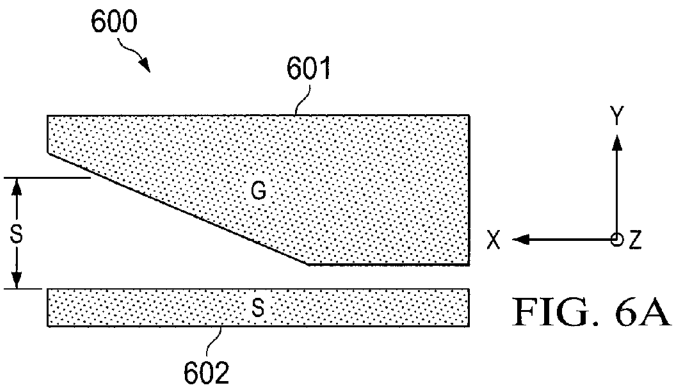
FIGS. 6A and 6B depict different views of a nonuniform ACPS coupler.
Figure 6B:
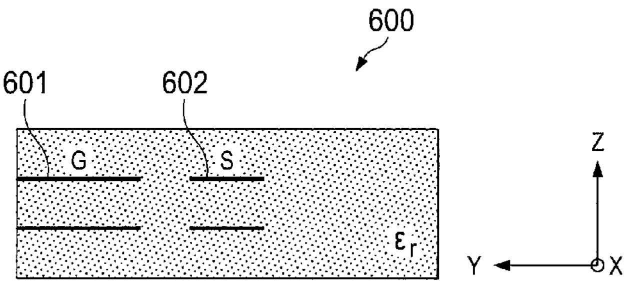
Figure 7A:
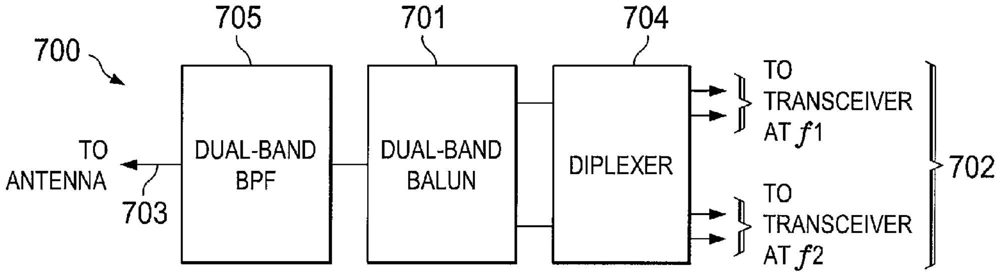
FIGS. 7A and 7B depict an example of a system using embodiments of the invention and a conventional system, respectively.
Figure 7B:
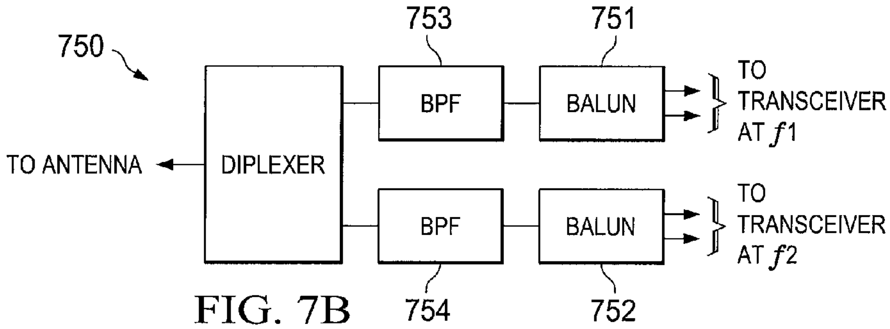

FIG. 7A depicts an example of a system using a dual band balun, according to embodiments of the invention. In this arrangement, system 700 transmits and receives at two frequencies. System 700 includes a dual band balun 701 for coupling the balanced inputs 702 to an unbalanced antenna 703. A diplexer 704 is used to switch merge/split the different signals. A dual band pass filter 705 is used to condition the signals. In contrast, a convention system 750, shown in FIG. 7B needs two baluns 751, 752, one for each frequency, along with two band pass filters 753, 754.

Figure 8A:
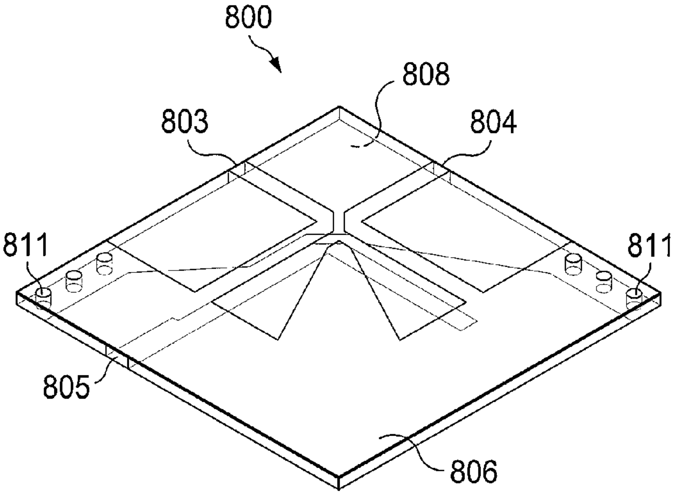
FIGS. 8A, 8B, and 8C depict different views of an ACPS UBW balun, according to embodiments of the invention.
Figure 8B:
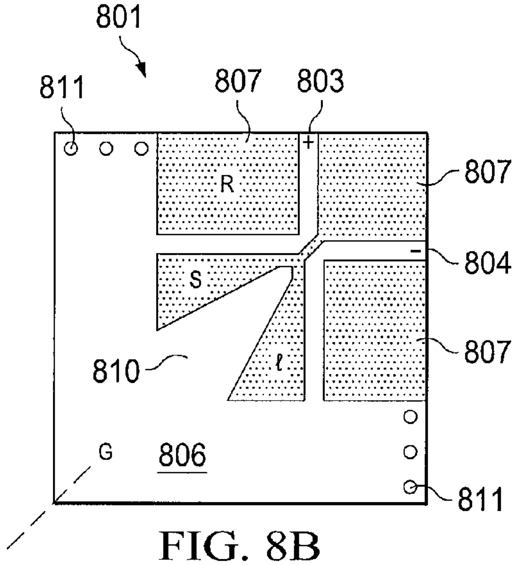
Figure 8C:
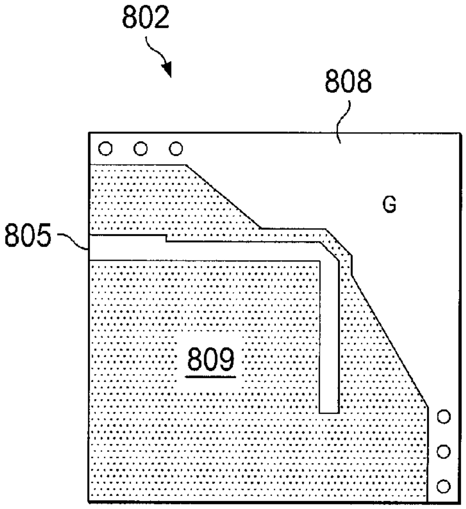

FIGS. 8A, 8B, and 8C depicts different views of an ACPS UBW balun, according to embodiments of the invention. FIG. 8A depicts a perspective view of the balun 800. FIG. 8B depicts a top-down view of the upper layer 801 of balun 800, and FIG. 8C depicts a top-down view of the bottom layer 802 of balun 800. Note that the upper and lower layers are by way of example only, as they could be reversed. The balun 800 comprises balanced ports 803, 804 and an unbalanced port 805. The other ends of lines (i.e. connecting to ports 803 and 804) are shorted to ground 806 through the lines with the length $\int$ approximately $\lambda g/4$, $\lambda g$ being the wavelength of operating frequency. In addition, the lines with the length of $\int$ on the top layer overlap the line connected to the port 805 on the bottom layer. The balun is formed from two nonuniform ACPS couple lines on two sides of a single layer of a printed circuit board (PCB). The upper layer 801 comprises the balanced ports 803, 804 with lines connected to the ground plane (conductor) 806. Area 807 comprises dielectric material. The ground plane 806 includes wedge portion 810, which forms a nonuniform ACPS and improves the bandwidth. The dimensions of wedge portion 180 may be adjusted to improve the balun performance for particular frequencies. The bottom layer 802 comprises the unbalanced port 805 and ground plane (conductor) 808. A portion of the line connected to the port 805 overlap the lines (i.e. connecting to ports 803 and 804) on the top layer with a resonator length $\int$. Area 809 comprises dielectric material. Vias 811 connect ground planes 806 and 808.

Figure 9A:
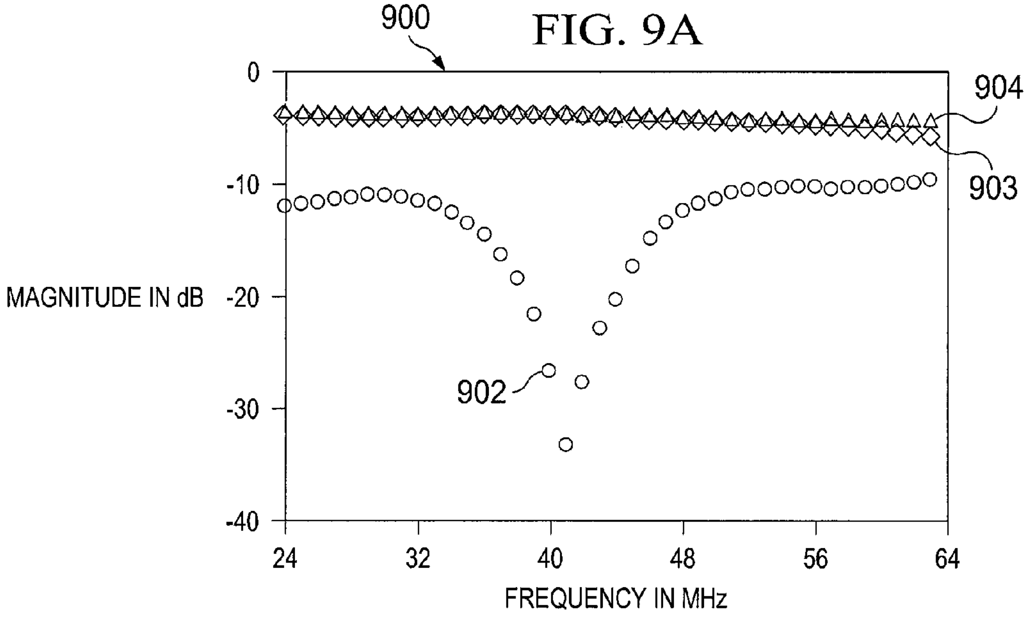
FIGS. 9A and 9B depict performance graphs of the balun of FIGS. 8A-8C.
Figure 9B:
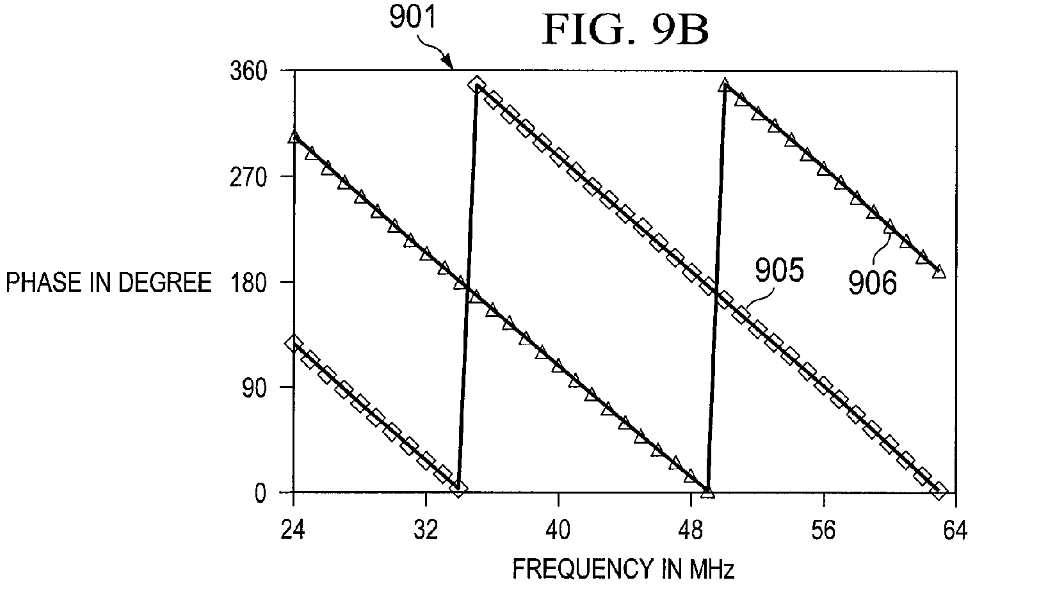

FIGS. 9A and 9B depict performance graphs of the balun of FIGS. 8A-8C. The balun of FIGS. 8A-8C, each of the ports 803, 804, and 805 are coupled to 50 Ohm resistors. FIG. 9A depicts the loss of the balun over frequency. Curve 902 depicts the reflection or return loss of the port 805, and curves 903, 904 depict the transmission or insertion loss between the port 805 and the ports 803, 804. Note that the amplitude balance is within ±0.5 dB over 32-50 MHz. Also note that the return loss is less than −10 dB in the working band. The dip in curve 902 indicates low reflection in the working band. The relatively flat and constant nature of curves 903 and 904 indicate good transmission throughout the working band. FIG. 9B depicts the phase effects of the balun over frequency. Curve 905 depicts the phase at port 805, and curve 906 depicts the phase at port 804. The phase at port 803 would be similar that of port 804. Note that the phase difference is within ±50 over 30 MHz to 50 MGHz. Thus, as indicated by the performance in the 30 MHz to 50 MHz range, balun 800 is suitable for use in MRI systems or other RF circuits which need the conversion between balanced ports and unbalanced ports.

Figure 10:
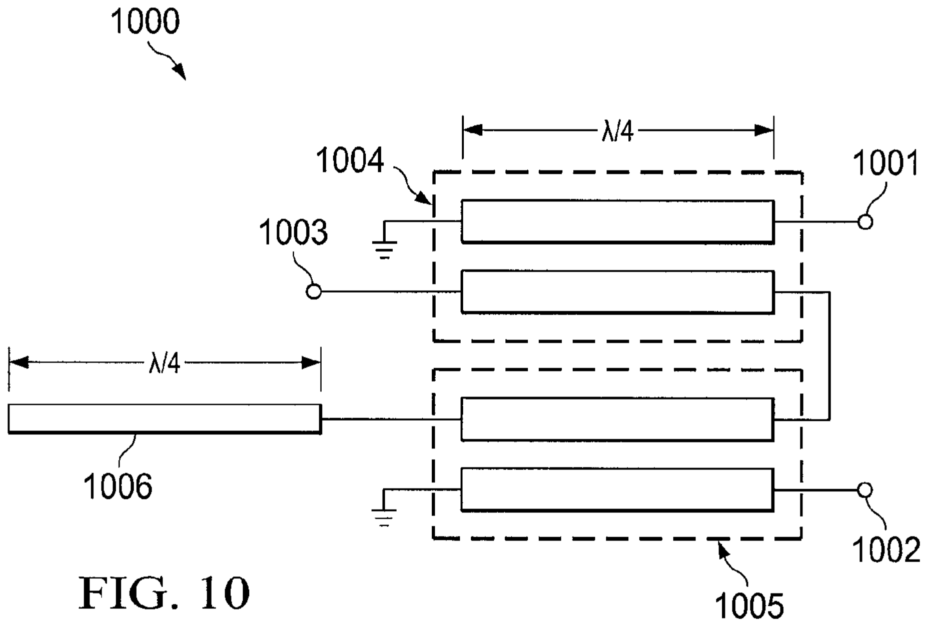
FIG. 10 depicts a schematic diagram of a dual band balun, according to embodiments of the invention.

FIG. 10 depicts a schematic diagram of a dual-band balun 1000, according to embodiments of the invention. The dual-band balun 1000 is a Marchand type balun antenna. The balun has an unbalanced port 1003 and a pair of balanced ports 1001, 1002. The balun includes two coupled line sections 1004, 1005, the length of which is around λ/4 (a quarter wavelength) of the operating frequency. The portions of the line sections that are connected to the balanced ports are shorted to ground. The portions of the line sections that are connected to the unbalanced port are connected to an open circuit (OC) through stub portion 1006. The stub portion 1006 may be around a quarter wavelength long (a quarter wavelength of the operating frequency). The stub portion 1006 may be implemented by a meandering microstrip to reduce the overall size. This balun has a wide operating bandwidth and introduces a strong rejection at the band center and improves return loss at two separate frequencies.

Figure 11A:
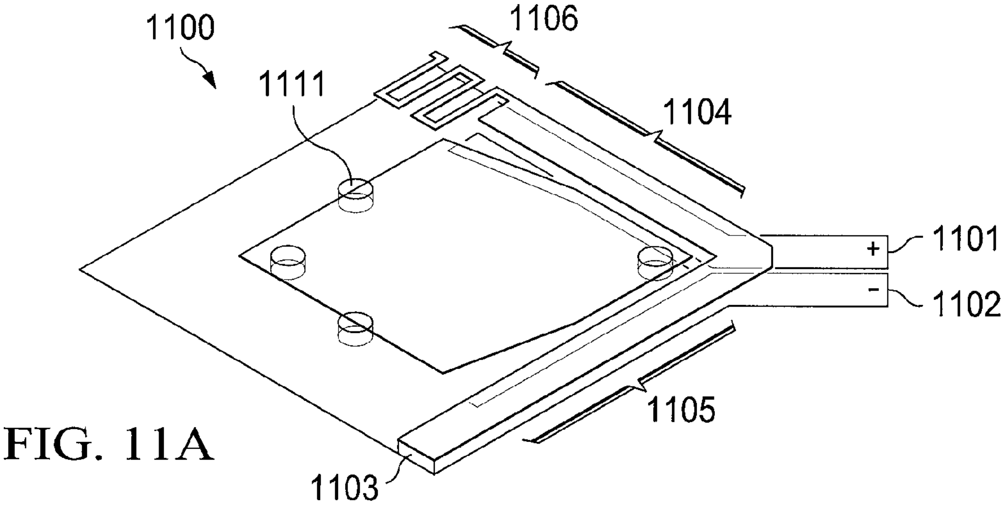
FIGS. 11A, 11B, and 11C depict different views of an example of a dual band balun of FIG. 10, according to embodiments of the invention.
Figure 11B:
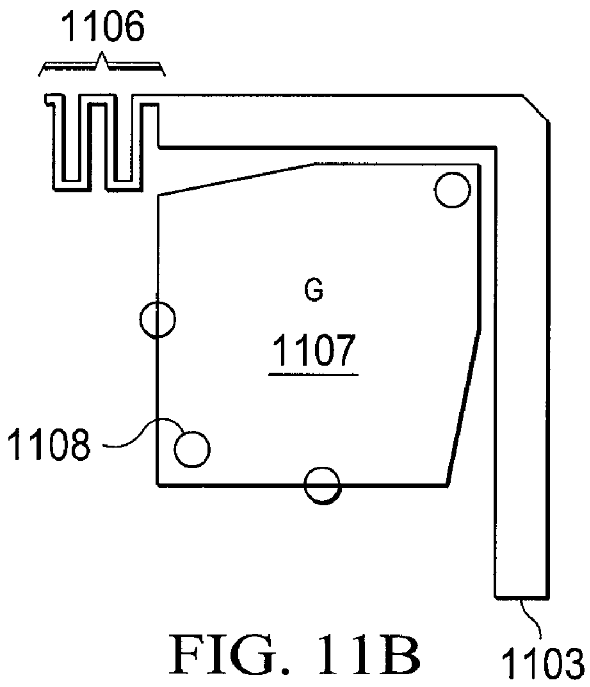
Figure 11C:
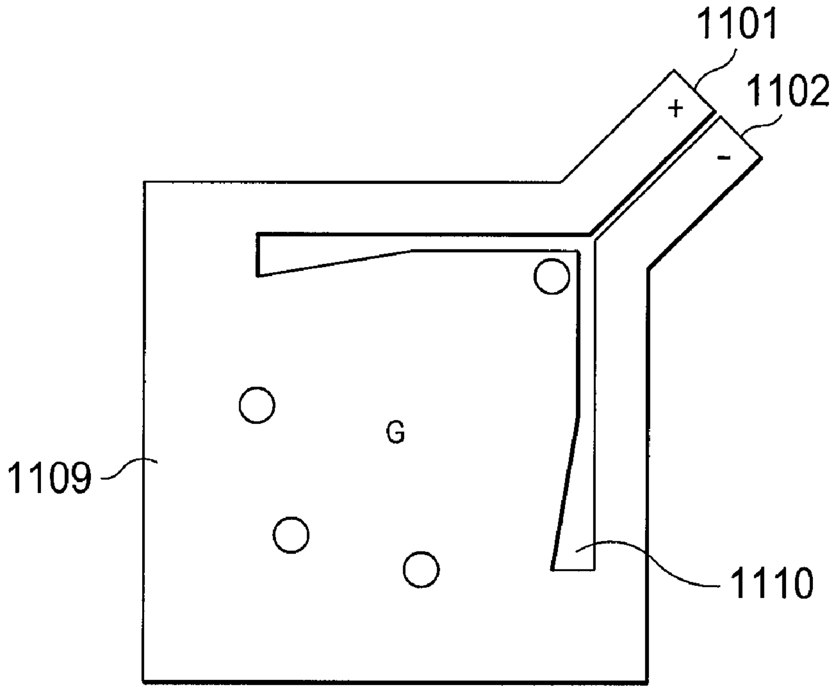

FIGS. 11A, 11B, and 11C depicts different views of an example of a dual band balun of FIG. 10, according to embodiments of the invention. FIG. 11A depicts a perspective view of the balun 1100. FIG. 11B depicts a top-down view of the upper layer of balun 1100, and FIG. 11C depicts a top-down view of the bottom layer of balun 1100. Note that the upper and lower layers are by way of example only, as they could be reversed. The balun 1100 comprises balanced ports 1101, 1102 and an unbalanced port 1103. The two coupling areas, which is the overlap between unbalanced port 1103 and balanced ports 1101, 1102 are shown as 1104 and 1105. The balun is formed from two nonuniform ACPS couple lines on two sides of a single layer of PCB. The upper layer comprises the unbalanced port 1103 and ground plane (conductor) 1107. Area 1108 comprises dielectric material. The upper layer also includes stub portion 1106. Note that in this example, the stub portion in meandered to reduce the footprint of the stub portion. Note that the meandering is by way of example only as other meander patterns may be used or no meandering may be used. The lower layer comprises the balanced ports 1101 and 1102 and ground place (conductor) 1109. Area 1110 comprises a dielectric material. Vias 1111 connect ground planes 1107 and 1109.

Figure 12:
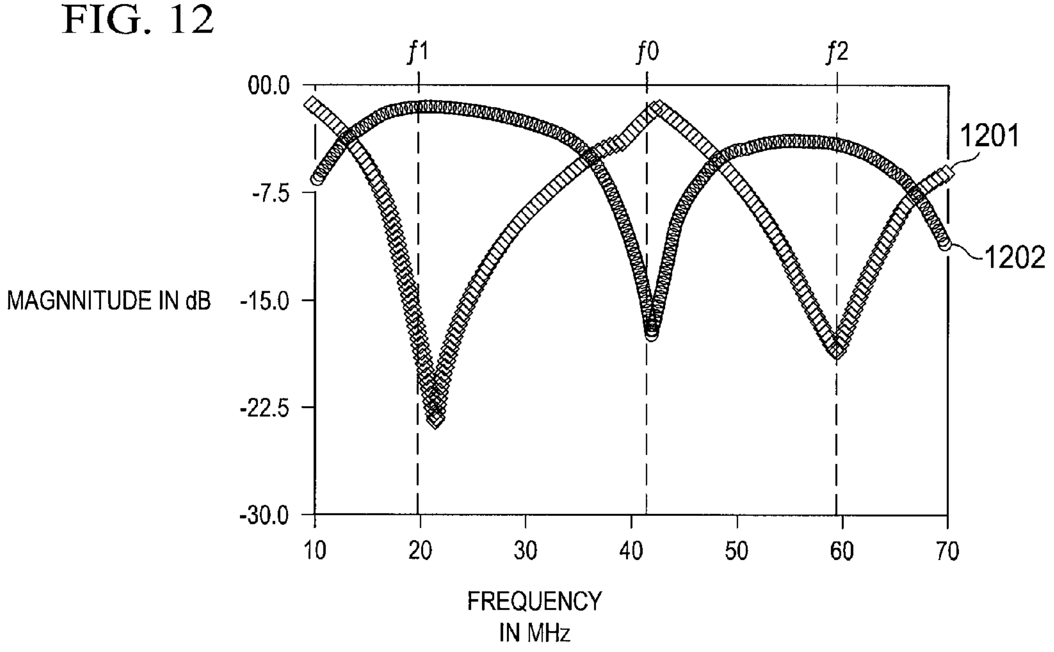
FIG. 12 depicts a performance graph of an example of the balun of FIGS. 11A-11C.
Figure 13:
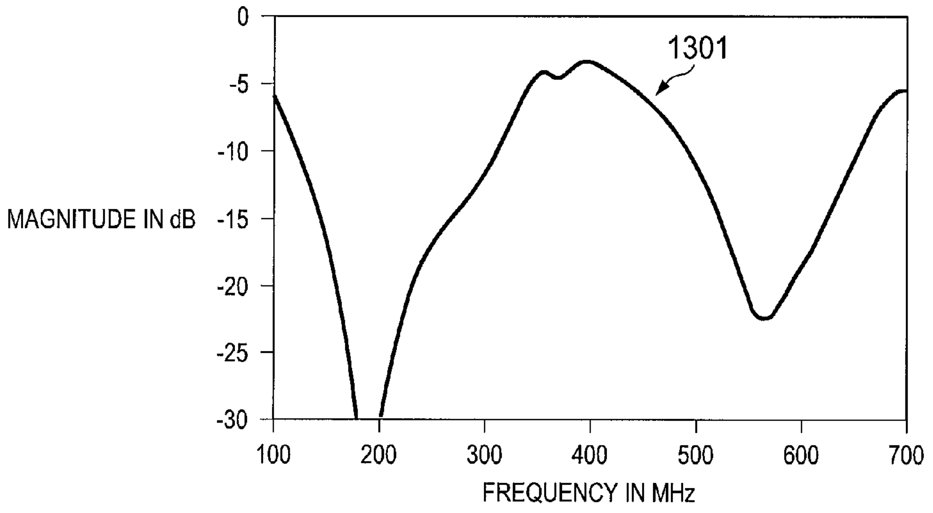
FIG. 13 depicts a performance graph of another example of the balun of FIGS. 11A-11C.

FIG. 12 depicts a performance graph of an example of a balun of FIGS. 11A-11C. In this example, each of the ports 1101, 1102, and 1103 are coupled to 50 Ohm loads. FIG. 13 depicts the performance of balun over frequency. Curve 1201 depicts the reflection or return loss of the unbalanced port (1103), and curve 1202 depicts the transmission or insertion loss between unbalanced port (1103) and unbalanced ports (1101, 1102). The location off $f\mathbf{0}$, $f\mathbf{1}$ and $f\mathbf{2}$ are determined by the stub length. The $f\mathbf{1}$ and $f\mathbf{2}$ also depend on the coupling strength of the balun. The return loss can also be adjusted by the stub impedance. The frequencies $f_1$ and $f_2$ are lower and upper working bands, respectively. The dips of the blue curve show that the balun has two distinct operating bands. The red curve shows good transmission performance in the working bands. The quarter-wavelength stub corresponds to $f_0$.

FIG. 13 depicts a performance graph of another example of a balun of FIGS. 11A-11C. In this example, the balanced port (i.e. 1101, 1102) is coupled to 100 Ohm resistors, and port 1103 is coupled to a 50 resistor. The stub length is around quarter wavelength at 400 MHz. The balun in this system is used for dual bands which are 200 MHz and 500 MHz bands. FIG. 13 depicts the performance of balun over frequency. Curve 1301 depicts the reflection or return loss of the unbalanced port 1103. The locations of $f\mathbf{1}$ and $f\mathbf{2}$ are determined by the length of the stub and coupling strength of the balun. The return loss can also be adjusted by the stub impedance. The frequencies $f_1$ and $f_2$ are lower and upper working bands, respectively. The dips of the blue curve show that the balun has two distinct operating bands. Note that there is more than 15 dB return loss at the 200 MHz band, and more than 15 dB return loss at the 500 MHz band.

It should be noted that while the examples of FIGS. 9A, 9B, 12, and 13 show performance in specific frequency bands, the scope of embodiments is not so limited. In fact, embodiments can be designed to operate at any radio frequency (RF) band through scaling and shaping. Further, the specific shapes and designs shown herein are exemplary, as other embodiments can take different shapes and/or designs. Moreover, some embodiments of the invention include methods for use of baluns designed according to the concepts described herein.

Some embodiments can be deployed in MRI systems to feed balanced antenna elements. Additionally, some embodiments can be used in Near Field Coupling (NFC) applications, such as RFID. Other uses are also possible, such as, e.g., in handheld consumer devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A balun comprising:

a dielectric layer having a first side and a second side that is located opposite to the first side;

a first conductor layer located on the first side; and a second conductor layer located on the second side;

wherein the first conduction layer includes a first port portion, a second port portion and a ground portion;

wherein the second conduction layer includes a third port portion and a ground portion;

wherein a part of the first port portion overlaps a part of the third port portion to form a first resonating couple area, and a part of the second port portion overlaps with another part of the third port portion to form a second resonating couple area;

wherein the first port portion and the second port portion form a balanced port, and the third port portion forms an unbalanced port; and wherein the balun is a Marchand balun.

2. A balun comprising:

a dielectric layer having a first side and a second side that is located opposite to the first side;

a first conductor layer located on the first side; and a second conductor layer located on the second side;

wherein the dielectric layer, first conductor layer, and second conductor layer are formed on two sides of a single layer printed circuit board;

wherein the first conduction layer includes a first port portion, a second port portion and a ground portion;

wherein the second conduction layer includes a third port portion and a ground portion;

wherein a part of the first port portion overlaps a part of the third port portion to form a first resonating couple area, and a part of the second port portion overlaps with another part of the third port portion to form a second resonating couple area; and wherein the first port portion and the second port portion form a balanced port, and the third port portion forms an unbalanced port.

3. A balun comprising:

a dielectric layer having a first side and a second side that is located opposite to the first side;

a first conductor layer located on the first side; and a second conductor layer located on the second side;

wherein the first conduction layer includes a first port portion, a second port portion and a ground portion;

wherein the ground portion of the first conducting area comprises a wedge shaped ground that is located proximate to the first port portion and the second port portion such that the distance between the wedge shaped portion and the each of the port portions varies along each port portion;

wherein the second conduction layer includes a third port portion and a ground portion;

wherein a part of the first port portion overlaps a part of the third port portion to form a first resonating couple area, and a part of the second port portion overlaps with another part of the third port portion to form a second resonating couple area; and wherein the first port portion and the second port portion form a balanced port, and the third port portion forms an unbalanced port.

4. The balun of claim 3, wherein a part of the ground portion of the first conduction layer does not overlap a part of the ground portion of the second conduction layer.

5. The balun of claim 3, wherein the balun is a non-uniform, asymmetric coplanar striplines balun.

6. The balun of claim 3, further comprising:

a plurality of vias that connect the ground portion of the first conduction layer with the ground portion of the second conduction layer.

7. The balun of claim 3, wherein the balun receives an unbalanced signal and provides a balanced output.

8. The balun of claim 3, wherein the first port portion, the second port portion, and the third port portion are striplines.

9. The balun of claim 3, wherein the balun provides Ultra Wideband (UWB) performance.

10. The balun of claim 3, wherein the first resonating couple area and the second resonating couple area each has length of about λ/4, where λ is an operating frequency for the balun.

11. A balun comprising:

a dielectric layer having a first side and a second side that is located opposite to the first side;

a first conductor layer located on the first side; and a second conductor layer located on the second side;

wherein the first conduction layer includes a first port portion, a second port portion and a ground portion;

wherein the second conduction layer includes a third port portion, a stub portion, and a ground portion, and the stub portion is connected to the third portion;

wherein a part of the first port portion overlaps a part of the third port portion to form a first resonating couple area, and a part of the second port portion overlaps another part of the third port portion to form a second resonating couple area; and wherein the first port portion and the second port portion form a balanced port, and the third port portion forms an unbalanced port.

12. The balun of claims 11, comprising:

a wedge shaped ground portion that is located proximate to the first port portion and the second port portion such that the distance between the wedge shaped portion and the each of the port portions varies along each port portion.

13. The balun of claim 11, wherein the balun is a nonuniform, asymmetric coplanar striplines balun.

14. The balun of claim 11, wherein the stub portion has a length of a quarter-wavelength of a signal associated with the third port portion.

15. The balun of claim 11, wherein the stub portion has a meandered geometry to reduce a footprint of the stub portion.

16. The balun of claim 11 wherein the balun provides dual-band performance.

17. The balun of claim 11 wherein the balun has a strong rejection at a center frequency of an operating band, and the center frequency is determined by a length of the stub portion.

18. The balun of claim 11 wherein the balun has two regions of return loss located at two frequencies that are determined by a coupling strength of the balun and an impedance of the stub portion.

19. The balun of claim 11 further comprising:

a plurality of vias that connect the ground portion of the first conduction layer with the ground portion of the second conduction layer.

20. The balun of claim 11 wherein the balun is a Marchand balun.

21. The balun of claim 11 wherein the balun receives an unbalanced signal and provides a balanced output.

22. The balun of claim 11 wherein the first port portion, the second port portion, and the third port portion are striplines.

23. The balun of claim 11 wherein the first resonating couple area, the second resonating couple area, and the stub each has length of about λ/4, where λ is an operating frequency for the balun.

* * * * *